(12) United States Patent
Parkin et al.

(10) Patent No.: US 7,284,990 B2
(45) Date of Patent: Oct. 23, 2007

(54) PCB AND CONNECTOR DESIGN

(75) Inventors: Neil James Parkin, Ipswich (GB); Darren John Hayward, Ipswich (GB); Declan Reilly, Ipswich (GB)

(73) Assignee: Avago Technologies General IP (Singapore) Pte Ltd, Singapore (SG)

( * ) Notice: Subject to any disclaimer, the term of this patent is extended or adjusted under 35 U.S.C. 154(b) by 0 days.

(21) Appl. No.: 11/448,190

(22) Filed: Jun. 7, 2006

(65) Prior Publication Data

US 2006/0286823 A1 Dec. 21, 2006

(30) Foreign Application Priority Data

Jun. 17, 2005 (GB) ................................ 0512387.2

(51) Int. Cl.
*H01R 12/00* (2006.01)
(52) U.S. Cl. .................. 439/59; 439/951; 439/629
(58) Field of Classification Search .................. 439/59, 439/660, 629, 636, 637, 951
See application file for complete search history.

(56) References Cited

U.S. PATENT DOCUMENTS

| 5,378,159 | A | * | 1/1995 | Renn | 439/59 |
| 5,419,708 | A | * | 5/1995 | Koss et al. | 439/59 |
| 5,534,879 | A | | 7/1996 | Braun et al. | 343/713 |
| 5,547,405 | A | | 8/1996 | Pinney et al. | 439/894 |
| 6,024,587 | A | * | 2/2000 | Garth | 439/101 |
| 6,139,364 | A | | 10/2000 | Beutler et al. | 439/607 |
| 6,487,086 | B2 | * | 11/2002 | Ikeda | 361/772 |

FOREIGN PATENT DOCUMENTS

| GB | 929802 | 6/1963 |
| GB | 2 284 109 | 5/1995 |

* cited by examiner

*Primary Examiner*—Tho D. Ta

(57) ABSTRACT

A circuit board (PCB) and connector design, which provides for better electrical connection between the PCB and its host, especially for when used in high-speed optical systems. The PCB has an electrical flex embedded within it. The flex is connected to electrical component located on the PCB by means of a via at one end and protrudes from the PCB at the other end. The connector has a flex connection means arranged to receive the flex protruding from the PCB.

9 Claims, 2 Drawing Sheets

PCB AND CONNECTOR DESIGN

FIELD OF THE INVENTION

The present invention relates to an improved printed circuit board (PCB) and connector design, which provides for better electrical connection between the PCB and its host. More specifically the present invention relates to an improved PCB and connector design for use in high-speed optical transceivers.

DISCUSSION OF THE BACKGROUND ART

Currently high-speed data signals are routed on printed circuit boards using a strip line configuration. The strip lines help to reduce electromagnetic emissions and cross talk. High-speed data transmitted along the strip lines located either on the surface or embedded in the PCB must be passed to and from a host. This is usually done with an electrical connector into which the PCB is plugged. Electrical connection is made via strip lines located on the surface of the PCB. However, this causes discontinuities in the data line impedance, which has a negative effect on the data signal causing quality issues.

As can be seen in FIG. 1, which shows a cross section of PCB 10, differential strip lines 15 and 16 are embedded within the PCB and ground planes 11 and 12 are disposed on the upper and lower surfaces. FIG. 2 shows a longitudinal cross section of the PCB shown in FIG. 1. The strip line 15 is connected to an electrical component 17, such as an integrated circuit (IC), disposed on the surface of the PCB by means of via 21 and a further strip 8. The PCB is plugged into electrical connector 20 and electrical connection is established to the IC through a second via 22 and yet a further strip line 9. As can be seen, both strip lines 8 and 9 are located on the surface of the PCB. The discontinuities as indicated at points "A" along the strip lines and vias (8, 21, 15, 22, and 9) affect the signal quality due to changes in the impedance characteristics. The characteristic impedance of a transmission line such as a differential pair will change according to its distance from a ground plane, dielectric impedance and distance from another transmission line. All these parameters are affected by discontinuities.

Thus it is an object of the present invention to remove as many of these discontinuities as possible while maintaining low levels of electromagnetic emissions and increasing the data reliability. It is a further object of the present invention to provide a PCB and connector design which is compatible with pluggable optical transceivers.

SUMMARY OF THE INVENTION

Advantageously, by isolating the RF lines for data from the DC levels the present invention reduces crosstalk. Furthermore, by using a long flex strip line electromagnetic emissions are reduced.

BRIEF DESCRIPTION OF THE DRAWINGS

While the principal features and advantages of the present invention have been described above, a great understanding and appreciation of the invention may be obtained by reference to the drawings and detailed description of the invention, presented by way of example only, in which.

DETAILED DESCRIPTION OF THE PREFERRED EMBODIMENT

Figure 1:
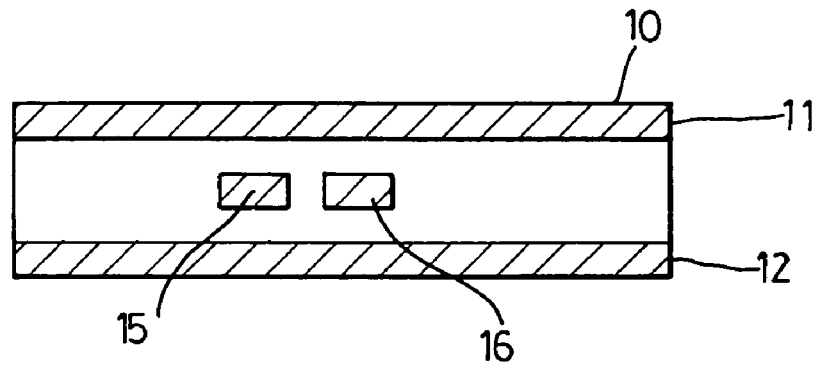
FIG. 1 is a schematic representation of a cross sectional view of a printed circuit board (PCB) according to the prior art.
Figure 2:
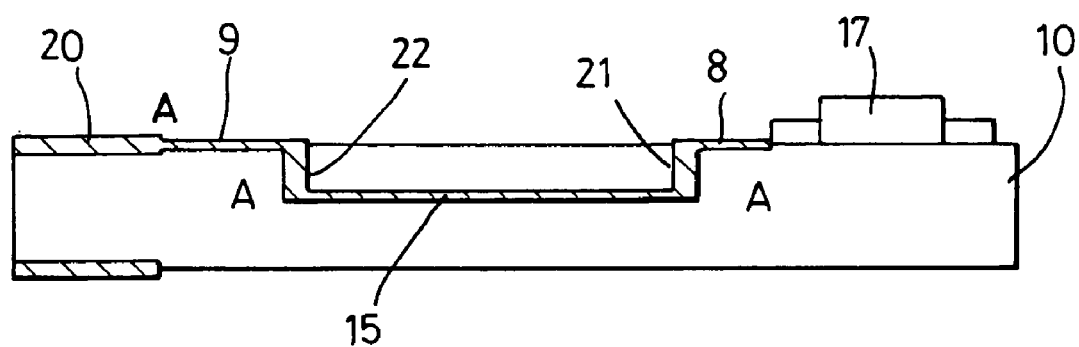
FIG. 2 is a longitudinal cross sectional view of the PCB according to FIG. 1.
Figure 3:
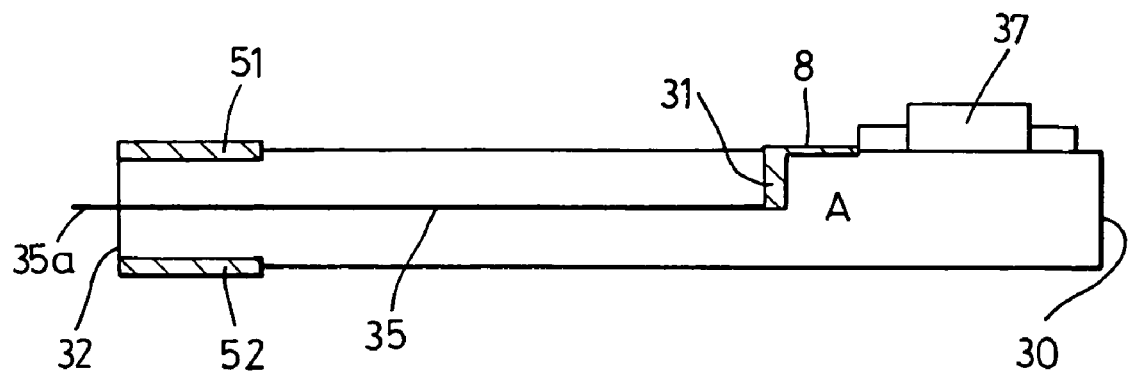
FIG. 3 shows a longitudinal cross section of the PCB according to the present invention.

In FIG. 3 PCB 30 is shown having an integrated circuit (IC) 37 disposed on its surface. Electrical connection from the PCB to its host is established by means of strip line 8, via 31, and strip line 35, which is embedded within the PCB. The strip line 35 may be composed of a flex layer. As can be clearly seen in FIG. 3 the flex layer 35 protrudes from end-face 32 of the PCB approximately midway between DC electrical connector pads 51 and 52. The flex protrusion 35a has contacts that are matched to the strip line characteristic impedance (typically 50 or 75 Ohms). The characteristic impedance is, in most high-speed environments, matched to the driver or receiver integrated circuit whose impedance will be in most cases 50-75 ohms. However, the impedance can be any value depending upon the circuitry. Advantageously the PCB design according to the present invention as shown in FIG. 3 has only one discontinuity to the data line as indicated at point "A".

Figure 4:
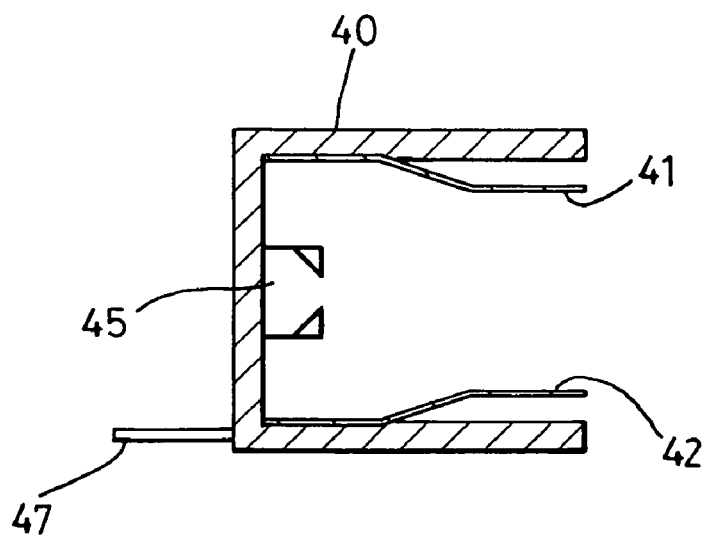
FIG. 4 shows a longitudinal cross section of the electrical connector compatible with the PCB shown in FIG. 3.

Now as seen in FIG. 4, which shows a cross section of an electrical connector design for receiving the PCB shown in FIG. 3, impedance matched RE connector 45 is disposed within PCB connector 40. RE connector 45 is arranged to receive flex protrusion 35a. DC connection is established between the PCE and the PCB connector by means of electrical contacts 41 and 42, which receive PCB contact pads 51 and 52.

As will be appreciated the present PCB and connector design is suitable for use with a fibre optic transceiver and for connecting this transceiver to its host board or chassis. This design allows for connection to the host board with the minimum of impedance mismatch. Furthermore the PCB and connector design of the present invention are particularly suited for high-speed digital signal transmission.

It is not intended that the present invention be limited to the above embodiments, and as will be appreciated further embodiment are envisioned within the scope of the claims. The invention can be realised in any embodiment that uses a transmission line and a media to carry the transmission line. As will be appreciated any material used for PCE manufacture could be used as the media, such as FR4 or ceramic material.

The invention claimed is:

1. An electrical assembly comprising:
   a substrate having a top surface, a bottom surface an end-face connecting the top surface and the bottom surface and an electrical component disposed on the top surface, the substrate having an electrical flex layer embedded within the substrate, the electrical flex layer forming a portion of a conductive path having a single electrical discontinuity, wherein a first end of the electrical flex layer is connected to the electrical component and a second end of the electrical flex layer is protruding from the end-face of the substrate; and
   an electrical connector that receives the second end of the electrical flex layer.

2. An assembly as claimed in claim 1, wherein the substrate comprises DC contact pads disposed on the surfaces proximate the protruding electrical flex layer, and wherein the electrical connector further comprises electrical contacts arranged to receive the DC contact pads.

3. An assembly as claimed in claim 1, wherein the electrical flex layer has a first impedance, and the electrical connector has a second impedance, and wherein the first and second impedances are matched to one another.

4. An assembly as claimed in claim 1, wherein a via connects the electrical component and the first end of the electrical flex layer by extending to a depth proximate the midline of the substrate.

5. An assembly as claimed in claim 4, wherein a strip line is disposed on the substrate top surface between the electrical component and the via.

6. An optical transceiver comprising an electrical assembly comprising:
   a substrate having a top surface, a bottom surface, an end-face connecting the top surface and the bottom surface and an electrical component disposed on the top surface, the substrate having an electrical flex layer embedded within the substrate, the electrical flex layer forming a portion of a conductive path having a single electrical discontinuity, wherein a first end of the electrical flex layer is connected to the electrical component and the second end of the electrical flex layer is protruding from the end-face of the substrate, the second end connected to a flex protrusion; and
   an electrical connector that receives the second end of the electrical flex layer.

7. The optical transceiver of claim 6, wherein the electrical flex layer has a first impedance and the electrical connector has a second impedance, and wherein the first and second impedances are matched to one another.

8. A high-speed data system comprising an electrical assembly comprising: a substrate having a top surface, a bottom surface, an end-face connecting the top surface and the bottom surface and an electrical component disposed on the top surface, the substrate having an electrical flex layer embedded within the substrate, the electrical flex layer forming a portion of a conductive path having a single electrical discontinuity, wherein a first end of the electrical flex layer is connected to the electrical component and the second end of the electrical flex layer is protruding from the end-face of the substrate, the second end connected to a flex protrusion; and
   an electrical connector that receives the second end of the flex layer.

9. The high-speed data system of claim 8, wherein the electrical flex layer has a first impedance and the electrical connector has a second impedance, and wherein the first and second impedances are matched to one another.

* * * * *